United States Patent

[11] 3,579,134

[72] Inventor Steven Morrison
Randallstown, Md.

[21] Appl. No. 867,321
[22] Filed Oct. 17, 1969
[45] Patented May 18, 1971
[73] Assignee Westinghouse Electric Corporation, Pittsburgh, Pa.,

[54] SYSTEM FOR STABILIZING AN OPERATIONAL AMPLIFIER
8 Claims, 1 Drawing Fig.

[51] U.S. Cl. .............................................. 330/3, 35, 30D, 20, 24
[52] Int. Cl. .............................................. H03f 5/00, H03f 3/16
[50] Field of Search .................................... 330/30D, 69, 35, 20, 16, 3

[56] References Cited

UNITED STATES PATENTS 3,325,742 6/1967 Moriyasv................. 330/3

*Primary Examiner*—Nathan Kaufman
*Attorney*—F. H. Henson, and E. P. Klipfel

ABSTRACT: Described is a system for direct current stabilizing an operational amplifier by means of a field effect common source differential amplifier with a current sink which drives a matched pair of PNP transistors in the common base configuration.

Figure 1:
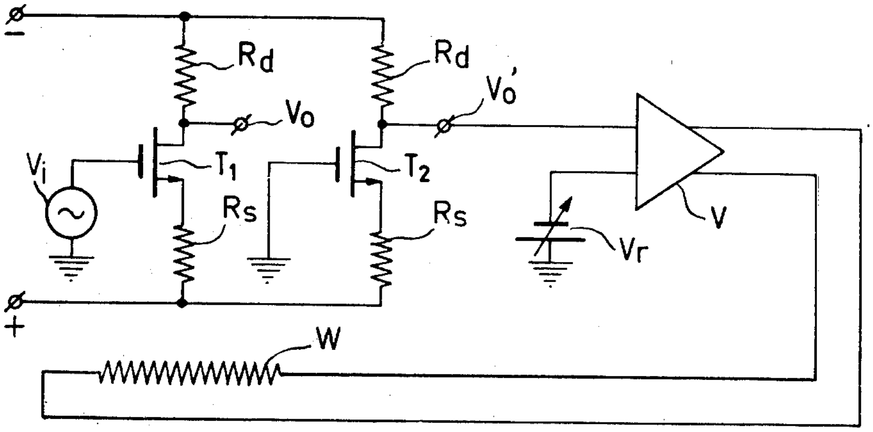
Figure 2:
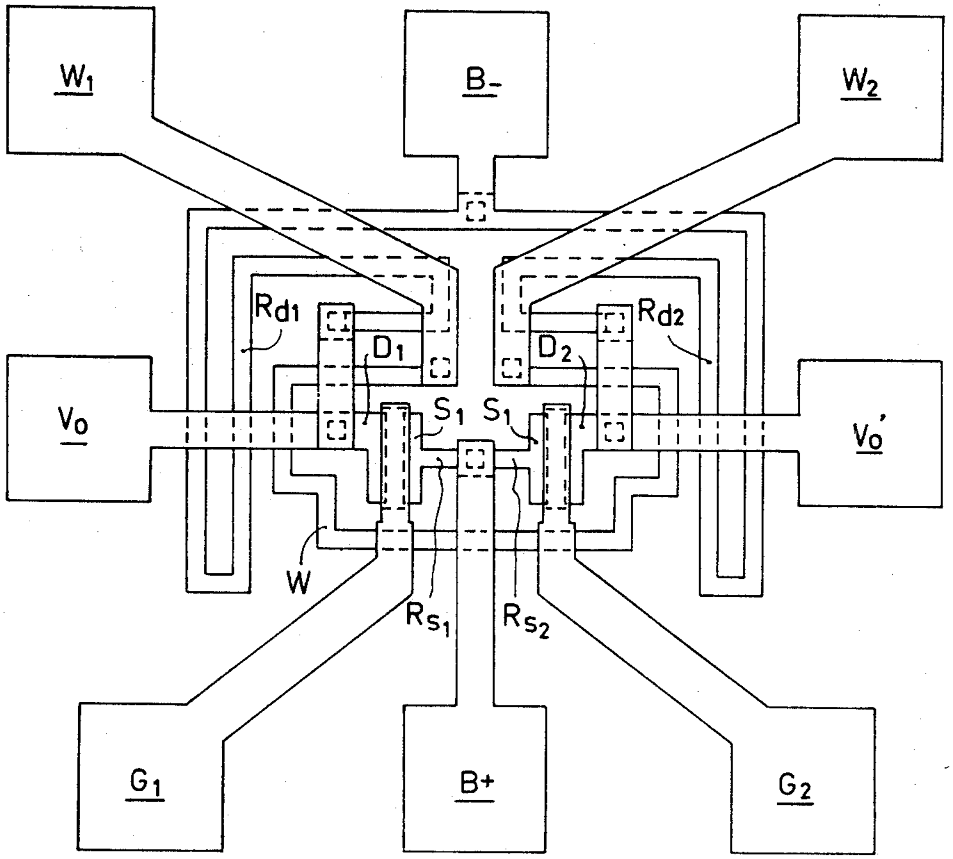

INVENTOR.
JEAN H.J. LORTEIJE
BY
AGENT

SYSTEM FOR STABILIZING AN OPERATIONAL AMPLIFIER

BACKGROUND OF THE INVENTION

Voltage drift or offset in differential operational amplifiers has long been a problem. For balancing of differential amplifiers, the output direct current reference level of the amplifier should be equal to the input direct current reference level in order to permit direct current feedback and interconnections of computer or the like elements. As a practical matter, however, an offset voltage or voltage drift occurs at the output, primarily because of the base-emitter voltage mismatch and the input current mismatch of transistors feeding into the operational amplifier. In the past, this voltage and current drift has usually been compensated for by a chopper in a feedback loop for the amplifier. Chopper stabilization of this type, however, requires relatively complicated circuitry and results in somewhat excessive output noise.

SUMMARY OF THE INVENTION

As an overall object, the present invention seeks to provide a new and improved system for direct current stabilization of an operational amplifier, which system overcomes the disadvantages of prior art methods employing chopper techniques.

More specifically, an object of the invention is to provide a system of the type described wherein stabilization of an operational amplifier is achieved by a field effect common source differential amplifier with a current sink which drives a matched pair of transistors in the common base configuration.

In accordance with the invention, a system for applying two input signals to an operational amplifier is provided comprising a matched pair of field effect transistors having their source electrodes connected through a common current sink to a source of negative potential. The drain electrodes of the field effect transistors are connected through resistors to a source of positive potential. The system includes a pair of transistors having their base electrodes both connected to a point of reference potential, together with means including the emitter and collector of one of the transistors for connecting the drain electrode of one of the field effect transistors to one input of the operational amplifier and means including the emitter and collector of the other of the transistors for connecting the drain electrode of the other field effect transistor to the other input of the operational amplifier.

By virtue of the fact that matched field effect transistors have extremely low offset currents and voltages, the voltage drift at the input to the operational amplifier is minimized. The common base transistors, which have a current gain of one, serve to reduce the voltage levels of the input signals below the maximum allowable value for the operational amplifier.

The above and other objects and features of the invention will become apparent from the following detailed description taken in connection with the accompanying single figure drawing which schematically illustrates one embodiment of the invention.

With reference now to the drawing, one of two differential inputs is applied to input terminal A and, hence, the gate electrode of the first field effect transistor 10 in an operational amplifier AA; while the other differential input is applied to terminal B and the gate electrode of a second field effect transistor 12 in amplifier AA. The drain electrodes of the field effect transistors 10 and 12 are connected through resistors 11 and 13, respectively, to a source of +25 volts; while the source electrodes of the field effect transistors are connected through a potentiometer 14, the emitter and collector of transistor 16, and resistor 18 to a source of −25 volts. The base of transistor 16 is grounded as shown and serves as a current sink.

The drain electrode of field effect transistor 10 is also connected to the emitter of transistor 20; while the drain electrode of field effect transistor 12 is connected to the emitter of transistor 22. The bases of transistors 20 and 22 are both connected to the cathode of a Zener diode 24 which obtains current drive through resistor 26 from the +60 volt supply. The voltage $V_z$ on the cathode of diode 24 will be the Zener breakdown voltage of the diode 24.

The collector of transistor 20 is connected to ground through resistor 28 as well as to one input of an operational amplifier 30; while the collector of transistor 22 is connected to ground through resistor 32 as well as to the other input of the operational amplifier 30. The amplifier 30 may take various forms; however in the particular embodiment of the invention shown herein it includes two feedback paths, one of which includes a capacitor 34 and the other of which includes a resistor 36 and capacitor 38 in series.

The operation of the circuit shown in the drawing can be explained from the following mathematical analysis:

From the drawing, it can be seen that $I_{c1}$, the current through resistor 11 is:

$$I_{c1}=\frac{25-(V_z+V_{be}+\Delta V_{be})}{R_{11}} \quad (1)$$

where $V_z$ is the voltage on the cathode of Zener diode 24, $V_{be}$ is the nominal base-to-emitter voltage of transistors 20 and 22, and $\Delta V_{be}$ is the differential voltage drift of the matched pair of transistors 20 and 22 in microvolts per °C.

The emitter current of transistor 20, $I_{e1}$, is:

$$I_{e1}=I_{c1}-(I_D+\Delta I_D) \quad (2)$$

where $I_D$ is the drain current of either of the field effect transistors 10 or 12 and $\Delta I_D$ is:

$$\Delta I_D=g_m\Delta V_{gs} \quad (3)$$

where $g_m$ is the transconductance of the field effect transistors and $\Delta V_{gs}$ is the differential drift (gate to source) of the matched field effect pair in microvolts per °C. Therefore, $I_{e1}$ is:

$$I_{e1}=\frac{25-(V_z+V_{be}+\Delta V_{be})}{R_{11}}-(I_D+\Delta I_D) \quad (4)$$

Likewise, the emitter current of transistor 22, $I_{e2}$, is:

$$I_{e2}=\frac{25-(V_z+V_{be})}{R_{13}}-I_D$$

Therefore, assuming $R_{11}=R_{13}=R_1$, $$I_{e1}-I_{e2}=-\frac{\Delta V_{be}}{R_1}-\Delta I_D \quad (6)$$

Since $\Delta I_D=g_m\Delta V_{gs}$:

$$I_{e1}-I_{e2}=-\frac{\Delta V_{be}}{R_1}-g_m\Delta V_{gs} \quad (7)$$

Furthermore, the difference in the voltages applied to the operational amplifier $\Delta E_0$ is:

$$\Delta E_0=E_{01}-E_{02}=-R_2\left[\frac{\Delta V_{be}}{R_1}+g_m\Delta V_{gs}\right] \quad (8)$$

where $R_2$ is the resistance of resistor 28 or 32.

The input offset voltage drift $\Delta_u$ of the operational amplifier shown in the drawing can be added directly to equation (8) to produce:

$$\Delta E_0=-R_2\left[\frac{\Delta V_{be}}{R_1}+g_m\Delta V_{gs}+\frac{\Delta_u}{R_2}\right] \quad (9)$$

The gain of this stage from either input is $g_m R_2$. Hence, $\Delta E_0$ referred to the input, $\Delta E_i$, is:

$$(10) \qquad \Delta E_i = \frac{\Delta E_0}{g_m R_2} = -\left[\frac{\Delta V_{be}}{g_m R_1} + \Delta V_{gs} + \frac{\Delta_u}{g_m R_2}\right],$$

where $\Delta_u$ is the input offset voltage drift of operational amplifier 30 in microvolts per °C.

For a $g_m = 500 \times 10^{-6}$ mhos, $R_1 = 15{,}400$ ohms, $R_2 = 4120$ ohms and $\Delta V_{be} = 10$ microvolts/°C
$\Delta V_{gs} = 10$ microvolts/°C
$\Delta_u = 6$ microvolts/°C.

The maximum differential voltage drift, $\Delta E_i$, is 14.2 microvolts per °C. The initial input offset voltage is nulled out by adjustment of the tap on potentiometer 14.

It can thus be seen that the present invention provides a stabilized operational amplifier with better performance characteristics, with respect to voltage drift, than conventional chopper stabilized operational amplifiers. Current drift has been eliminated since field effect characteristics have negligible input currents. Furthermore, the circuit provides for less output noise, greater reliability, less complexity, and less parts and lower cost.

Although the invention has been shown in connection with a certain specific embodiment, it will be readily apparent to those skilled in the art that various changes in form and arrangement of parts may be made to suit requirements without departing from the spirit and scope of the invention. In this respect, it will be appreciated that while PNP transistors have been shown herein, NPN transistors can be used with equal effectiveness.

I claim as my invention:

1. A system for applying two input signals to an operational amplifier, comprising a pair of field effect transistors having their source electrodes connected through a common current sink to a source of negative potential, means connecting the drain electrodes of said field effect transistors to a source of positive potential, a pair of transistors having their base electrodes both connected to a point of constant potential, means including the emitter and collector of one of said transistors for connecting the drain electrode of one of said field effect transistors to one input of said operational amplifier, and means including the emitter and collector of the other of said transistors for connecting the drain electrode of the other of said field effect transistors to the other input of said operational amplifier.

2. The system of claim 1 wherein said point of constant potential is established by means of a resistor and a Zener diode.

3. The system of claim 1 wherein the means for connecting the drain electrodes of said field effect transistors to a source of positive potential comprises a pair of resistors.

4. The system of claim 1 wherein the source electrodes of said field effect transistors are connected to opposite ends of a potentiometer having a movable tap, the movable tap being connected through said current sink to said source of negative potential.

5. The system of claim 1 wherein said current sink comprises a transistor having its base connected to a point of reference potential, the emitter and collector of said transistor connecting the source electrodes of said field effect transistors to said source of negative potential.

6. The system of claim 1 wherein said transistors are of the PNP type and the emitters of said transistors are connected to the drain electrodes of the respective field effect transistors.

7. The system of claim 1 wherein input differential signals are applied to the gate electrodes of the respective field effect transistors.

8. The system of claim 6 including resistors connecting the collectors of said PNP transistors to a point of reference potential.

UNITED STATES PATENT OFFICE

CERTIFICATE OF CORRECTION

Patent No. 3,579,134 Dated May 18, 1971

Inventor(s) Steven Morrison

It is certified that error appears in the above-identified patent and that said Letters Patent are hereby corrected as shown below:

On the cover sheet the illustrative drawing should appear as shown below:

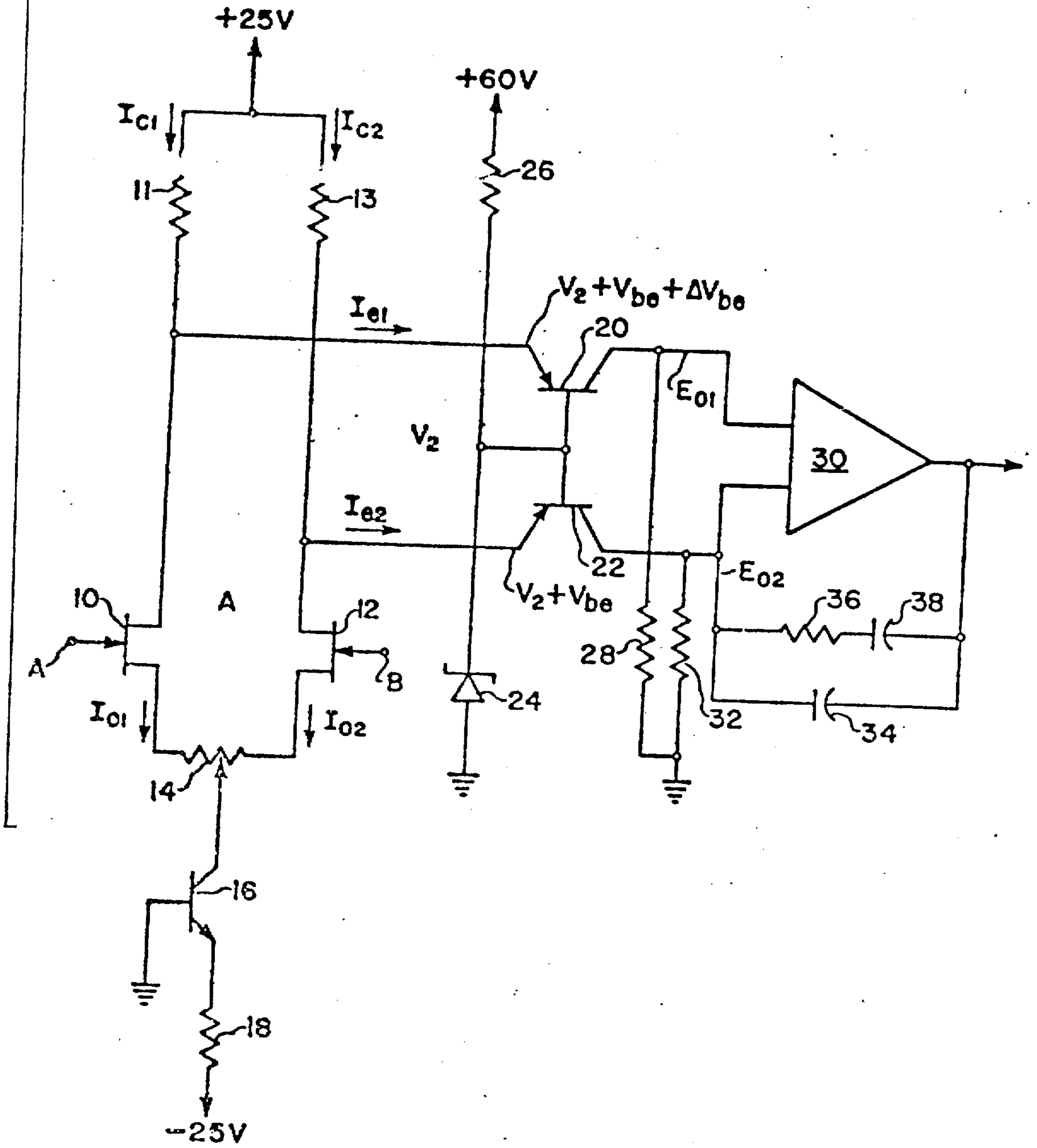

FORM PO-1050 (10-69)

USCOMM-DC 60376-P69
* U.S. GOVERNMENT PRINTING OFFICE : 1969 O—366-334

UNITED STATES PATENT OFFICE

CERTIFICATE OF CORRECTION

Patent No. 3,579,134 Dated May 18, 1971

Inventor(s) Steven Morrison PAGE - 2

It is certified that error appears in the above-identified patent and that said Letters Patent are hereby corrected as shown below:

Signed and sealed this 10th day of October 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334.